(12) United States Patent
Nieto

(10) Patent No.: US 6,182,359 B1
(45) Date of Patent: Feb. 6, 2001

(54) MANUFACTURING PROCESS FOR PRINTED CIRCUITS

(75) Inventor: Rodolfo Krobel Nieto, Vilafortuny (ES)

(73) Assignee: Lear Automotive Dearborn, Inc., Southfield, MI (US)

( * ) Notice: Under 35 U.S.C. 154(b), the term of this patent shall be extended for 0 days.

(21) Appl. No.: 09/355,570

(22) PCT Filed: Jan. 28, 1998

(86) PCT No.: PCT/US98/01067
§ 371 Date: Jul. 30, 1999
§ 102(e) Date: Jul. 30, 1999

(87) PCT Pub. No.: WO98/34444
PCT Pub. Date: Aug. 6, 1998

(30) Foreign Application Priority Data

Jan. 31, 1997 (ES) .................................................. 9700184

(51) Int. Cl.⁷ ...................................................... H01K 3/22
(52) U.S. Cl. ............................... 29/848; 29/840; 29/846
(58) Field of Search ........................... 29/840, 881, 848, 29/846

(56) References Cited

U.S. PATENT DOCUMENTS

| | | |
|---|---|---|
| 3,138,503 | 6/1964 | Taraud . |
| 3,177,103 | 4/1965 | Tally . |
| 3,350,250 * | 10/1967 | Sanz et al. ............................. 29/846 |
| 3,352,730 * | 11/1967 | Murch, Jr. ............................. 29/846 |
| 3,889,363 * | 6/1975 | Davis . |
| 3,913,223 * | 10/1975 | Gigioux ................................ 29/848 |
| 3,932,253 * | 1/1976 | Elarde et al. ......................... 29/846 |
| 4,584,767 * | 4/1986 | Gregory ................................ 29/848 |
| 5,194,698 * | 3/1993 | Souto et al. .......................... 29/848 |
| 5,477,612 * | 12/1995 | Roberts ................................ 29/846 |
| 5,819,579 * | 10/1998 | Roberts ................................ 29/846 |

FOREIGN PATENT DOCUMENTS

| | | |
|---|---|---|
| 1 521 770 | 9/1969 | (DE) . |
| 1 665 944 | 4/1971 | (DE) . |
| 971775 | 10/1964 | (GB) . |

OTHER PUBLICATIONS

International Preliminary Examination Report.

* cited by examiner

*Primary Examiner*—Carl J. Arbes
(74) *Attorney, Agent, or Firm*—Brooks & Kushman P.C.

(57) ABSTRACT

A printed circuit manufacturing process includes starting with a piece of conductive material such as copper. One side of the conductive material is chemically machined or cut to form grooves corresponding to the desired design of the printed circuit. A dielectric material is then injection molded onto the conductive material so that the dielectric material fills the grooves that have been formed in one side of the conductive material. The opposite side of the conductive material is then subjected to a process to form the grooves that correspond to the desired printed circuit design. The grooves formed during this latter step preferably are coincident with those formed in a previous machining step. In one embodiment, more than one assembly of dielectric and conductive material are adhered together to form a double faced circuit.

12 Claims, 1 Drawing Sheet

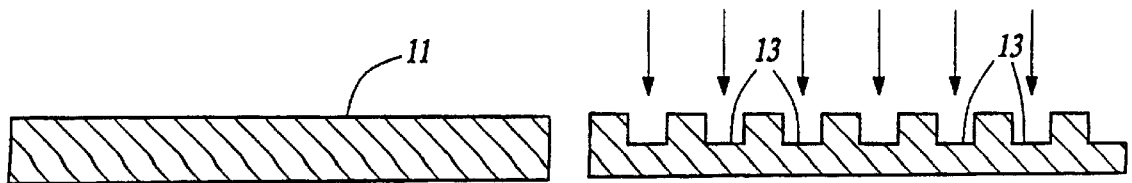
*Fig-1*
*Fig-2*
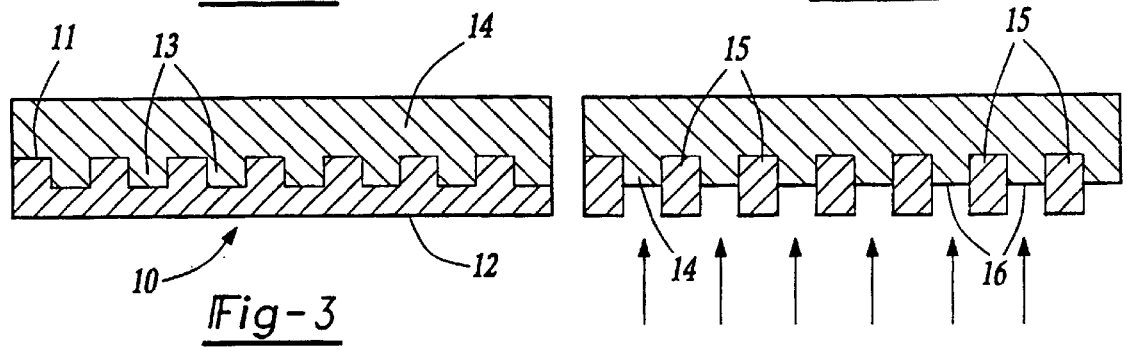
*Fig-3*
*Fig-4*
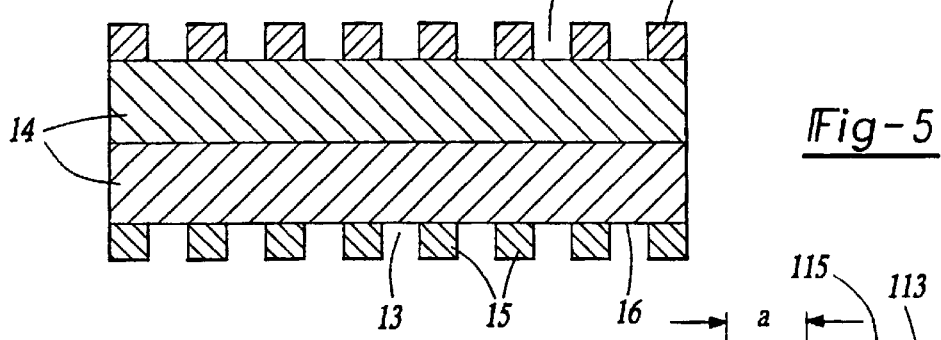
*Fig-5*
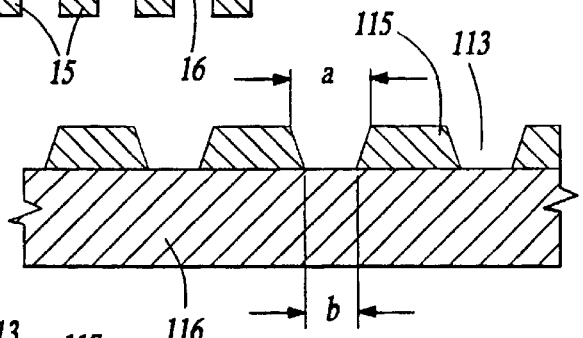
*Fig-6*
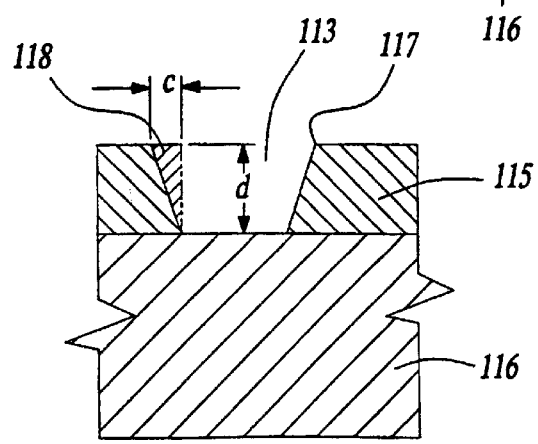
*Fig-7*

MANUFACTURING PROCESS FOR PRINTED CIRCUITS

BACKGROUND OF THE INVENTION

The present invention generally relates to a manufacturing process for printed circuits that includes a machining step for shaping a design for the printed circuit with maximum safety and efficiency. More specifically, the invention refers to a technology change in the manufacture of printed circuits that is most useful in making the type to be integrated into service boxes within vehicles.

Manufacturing processes, such as the ones disclosed in the Spanish Patent No. P9200325, which has common ownership with this application, are known. The increase in performances and therefore in the functions offered to a vehicle user requires a continuous improvement in quality, cost-effectiveness and size of the service boxes that contain the printed circuits. The size of the service box must be increased if there is a desire to follow with the practice of integrating the entirety of the printed circuits, plus the functions entrusted to the same, within a single service box.

All that has as a consequence that the space problem is most relevant. Even if the advancement in the integration of printed circuits as is disclosed in Spanish Patent No. P9501610 (having common ownership with this application) are important, the functions and performances mentioned above are still growing, since manufacturers are increasingly offering, even in compact cars or relatively lower-cost vehicles, performances and functions that were previously offered only in top class models.

Conventional procedures for manufacturing printed circuits start basically with a dielectric support, made of epoxy resins and glass fibers or the like. A copper plate is adhered to the dielectric support and the copper plate surface is covered with an anti-acid substance. The covered copper surface is then subjected to a chemical attack. The design of the cover ensures that the desired zones form a series of conductive tracks in the copper plate. Subsequently corresponding mechanizing with inserting machines introduces the chemically treated plates between the printed circuit thus forming components of any type and, in certain cases, forming an architecture on the bases of folding the plates by methods known as shown for example in Spanish Patent No. P9200325, and/or sewing with pins, either short and/or long as is known in the art.

The improvement degree on such circuits has arrived, no doubt and in some technical aspects from the use of increasingly greater copper plate thicknesses in order to be able to support in a smaller space equal or greater intensities. That way, the same surface of the printed circuit can integrate a greater number of elements, and therefore functions, all with the above-mentioned goal of being able to keep all the printed circuits in a reduced space (i.e., the service box).

The manufacturing of the tracks and therefore that of the inter-tracks and the space formed between two conductive tracks on the basis of the conventional technique (i.e., that of the chemical attack) produces certain grooves, formed by vertical walls that are not perpendicular to the top surface of the copper plate. This shortcoming of the prior art is that the inter-tracks form inclined planes on the side walls producing a loss of about three percent to four percent of the conductive surface. The percentage of loss tends to increase when further copper thicknesses are used in such circuits, as disclosed for example, in Spanish Patent No. P501610 (having common ownership with this application).

As can be seen in FIG. 6, with conventional methods of printed circuit manufacturing, a copper plate is adhered over a dielectric support 116. The copper plate is covered in the areas where the chemical attack is not desired. Producing the chemical attack over the copper plate results in the corresponding tracks 115 and the grooves or inter-tracks 113 having walls in the shape of inclined planes. The distance between tracks in the lower part of the grooves, where there is the interface between the copper plate with the dielectric substrate, has a smaller width than in the upper part of the same.

The result of the production of the grooves 113 with inclined walls, as shown in FIG. 6, is better seen in FIG. 7, which illustrates how a volume 118 of the conductive track 115 is lost. The amount of volume that is lost results from the loss of material coming from the simple product of the height "d" of the material by the width "c" by the length of the track 115.

It is therefore desirable to provide a printed circuit manufacturing process that meets the needs of modern systems while avoiding the shortcomings and drawbacks of the prior art described above.

SUMMARY OF THE INVENTION

In general terms, this invention is a manufacturing process for making printed circuit boards. The process begins with taking a copper plate and machining grooves into the plate in accordance with the desired design of the printed circuit. A dielectric material is then injection molded onto the conductive plate so that the dielectric material fills the grooves that have been machined. This results in a two layer assembly of the dielectric on one side and the conductive material on the other side. The exposed conductive material is then subjected to one of three processes to form grooves that coincide with the grooves that were previously machined. The three processes can include a conventional chemical attack, chemical machining or cutting. The process results in tracks and grooves having better geometric characteristics than those accomplished with the prior art.

The object of the present invention is that of introducing a new way of manufacturing printed circuits, in order to be able to absorb the losses of the three percent or four percent that happen when manufacturing printed circuits with traditional methods. Further, this invention simplifies the manufacturing of printed circuits on the base of grouping a series of operations in a single assembly. This allows some of the manufacturing operations to be performed in the plant of the printed circuit manufacturer itself. Further, this invention eliminates the need for the techniques of forming a negative of the desired configuration and the later, chemical attack used in the prior art. Therefore, this invention provides a gain in manufacturing speed and utilizes processes with no adverse consequences for the environment.

Other details and characteristics of the invention will be manifest through the reading of the detailed description given below, in which reference is made to the figures attached to the description. These details are given as an example, referring to a case of a practical embodiment, that is not limited to the details outlined. Therefore the following description must be considered from an illustrative point of view and with no limitations whatsoever.

BRIEF DESCRIPTION OF THE DRAWINGS

FIG. 1 is an elevational, cross-sectional view of a conventional copper plate useful for printed circuit manufacturing.

FIG. 2 illustrates the plate of FIG. 1 after it has been subjected to a chemical machining or chemical cutting process.

FIG. 3 is an elevational, cross-sectional view of the embodiment of FIG. 2 with an injection molded dielectric substrate attached.

FIG. 4 is an elevational, cross-sectional view of the embodiment of FIG. 3 later in the inventive process.

FIG. 5 shows another embodiment where two products made as shown in FIG. 4 are joined together.

FIG. 6 illustrates the state of the art.

FIG. 7 is an enlargement of the circled portion of FIG. 6.

DETAILED DESCRIPTION OF THE PREFERRED EMBODIMENT

The operations integrating the printed circuit manufacturing process of this invention begin with a copper plate 10 having an upper face 11 and a lower face 12. As shown in FIG. 2, chemical machining or cutting is used to produce grooves or inter-tracks 13 as indicated by the arrows. FIG. 2 is a schematic and illustrative illustration of one embodiment of this invention.

There follows after the chemical cutting or machining process, an injection molding process to fold a fully dielectric material or substance of a generally plastic type within the machined grooves 13. The injection molded material most preferably is capable of withstanding high temperatures, since afterwards the assembly preferably is introduced into a wave welding machine for purposes that will become apparent below. If the plastic is not of such special characteristics, it could not withstand the temperature and distortions could be produced in the printed circuit that is manufactured.

The injection molding operation serves two basic purposes. First, it gives the necessary dielectric support to the printed circuit. Second, it efficiently protects the inter-tracks 13 formed in the copper plate, in which can be seen that the walls of the grooves or inter-tracks are nearly fully vertical (i.e., perpendicular to the outside face of the copper plate). The injection molded dielectric also gives a certain mechanical stiffness to the assembly.

There follows the same process in the lower part, as represented in FIG. 4, preceding again to a chemical attack, chemical machining or cutting operation to form the inter-tracks 15. As can been seen in the drawing, the cross-section of the inter-tracks 15 is practically rectangular, with the result that the loss of material or volume (118 as shown in FIG. 7) does not happen, which would otherwise be the consequence of the conventional methods forming inclined planes instead of vertical ones in the inter-track walls. The embodiment of FIG. 3 is subjected to the chemical attack, machining or cutting process to form the grooves 16 coincident with the grooves 13, which have previously been filled with the dielectric material 14. Any of the above three processes can be used for this step.

With the circuit formed this way by this new procedure, double faced circuits can be formed as shown in FIG. 5. In one embodiment, the deposition of an adhesive in order to glue more than one assembly together facilitates forming a double faced circuit. The wave welding mentioned above provides a suitable method of joining two dielectric layers when the material has the desired heat-resistant characteristics. Alternatively other joining methods can be used including sewing single circuits, by techniques such as those of short pins or long pins, as disclosed in the Spanish Patent No. P9200356 and as are known in the art.

Other conductive material plates of conductive characteristics similar to those of copper can be used. A variety of substances with dielectric properties can be used and preferably include the above-mentioned characteristics of being able to withstand high temperature and being able to be used easily in an injection molding process in order to penetrate between the inter-tracks 13. The dielectric most preferably can be treated with a glue or adhesive in order to form double circuits as shown in FIG. 5. Temperature resistant properties of the dielectric 14 preferably accommodate a molding process for joining two assemblies.

Further to the above-mentioned advantages of this new method of circuit manufacturing, a better insulation of the inter-tracks 13 is achieved because of the easiness of the molding injection operation in order to be able to produce a higher or lower pressure over the material to be injected, as well as choosing the most appropriate nature of the same, such as flow, density, etc. Further, no later protection of the inter-tracks 13 with varnish is required. Alternatively and on the same inventive idea, the molding operation may be substituted with the application of a simple coating of the base 11 after the grooves 13 have been formed in its surface, refilling the grooves 13 with any material of dielectric nature. The same later steps described above preferably then are used to complete the circuit manufacturing process.

The preceding description is exemplary and not limiting. The scope of protection is only to be limited by the following claims.

What is claimed is:

1. A method of making a printed circuit, comprising the steps of:

(A) machining a plurality of channels in a first face of a piece of conductive material according to a desired configuration of the printed circuit;

(B) injection molding a dielectric material onto the first face of the conductive material such that the dielectric fills the channels formed during step (A); and (C) forming a plurality of channels in a second face of the piece of conductive material such that the dielectric material is exposed within the channels.

2. The method of claim 1, wherein step (A) is performed using a chemical machining process on the first face of the conductive material.

3. The method of claim 1, wherein step (A) is performed using a chemical cutting process.

4. The method of claim 1, wherein step (A) includes forming the channels through approximately one-half of a thickness of the conductive material.

5. The method of claim 4, wherein step (C) includes forming the channels through approximately one-half of the thickness of the conductive material and forming the channels of step (C) coincident with the channels of step (A).

6. The method of claim 1, wherein steps (A) and (C) are performed to form channels having a rectangular cross section.

7. The method of claim 1, wherein step (B) includes forming a base of the dielectric material so that one side of the printed circuit comprises the dielectric material.

8. The method of claim 7, further comprising performing steps (A) through (C) on a second piece of conductive material and then attaching the respective one sides of dielectric material together in abutting relationship.

9. The method of claim 8, wherein the dielectric materials are attached using a heat-activated adhesive.

10. The method of claim 1, wherein step (C) is performed using a chemical cutting process.

11. The method of claim 1, wherein step (C) is performed using a chemical etching process.

12. The method of claim 1, wherein step (C) is performed using a chemical machining process.

* * * * *